(12) United States Patent
Kizaki et al.

(10) Patent No.: US 7,352,163 B2
(45) Date of Patent: Apr. 1, 2008

(54) EARLY EFFECT CANCELLING CIRCUIT, DIFFERENTIAL AMPLIFIER, LINEAR REGULATOR, AND EARLY EFFECT CANCELING METHOD

(75) Inventors: Yoshihiro Kizaki, Kasugai (JP); Katsuyuki Yasukouchi, Kasugai (JP); Hidenobu Ito, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 215 days.

(21) Appl. No.: 11/132,172

(22) Filed: May 19, 2005

(65) Prior Publication Data

US 2006/0192543 A1 Aug. 31, 2006

(30) Foreign Application Priority Data

Feb. 25, 2005 (JP) ............................. 2005-051250

(51) Int. Cl.
G05F 3/04 (2006.01)
G05F 3/08 (2006.01)

(52) U.S. Cl. ........................ 323/312; 323/313; 323/314

(58) Field of Classification Search ................ 323/312, 323/313, 314
See application file for complete search history.

(56) References Cited

U.S. PATENT DOCUMENTS 4,847,519 A * 7/1989 Wahl et al. .................. 327/536
5,307,007 A * 4/1994 Wu et al. ..................... 323/313
5,448,158 A * 9/1995 Ryat ............................ 323/315
6,130,565 A * 10/2000 Nagano et al. .............. 327/157
6,166,529 A * 12/2000 Ikeuchi et al. ............... 323/315
6,525,596 B2 * 2/2003 Hosono et al. .............. 327/540
6,927,622 B2 * 8/2005 Rashid et al. ................ 327/538
7,023,181 B2 * 4/2006 Nakata ......................... 322/28

FOREIGN PATENT DOCUMENTS

JP 2001-147726 5/2001
JP 2002-244748 8/2002

* cited by examiner

Primary Examiner—Bao Q. Vu
(74) Attorney, Agent, or Firm—Arent Fox LLP

(57) ABSTRACT

In an input transistor of current mirror circuit, it is intended to prevent the current generated by Early effects from appearing in the output current of the current mirror circuit. Having an Early voltage detector 22 of same connection and structure as a driver circuit 21, and connected in parallel to the driver circuit 21, the current flowing in input transistor Q9 of the Early voltage detector 22 is detected. Output current (current IQ11) of Early voltage detector 22 is added to input current (current IQ5) of driver circuit 21. As a result, in input current (current IQ7) of current mirror circuit 25, current α due to Early voltage effects can be canceled. At the same time, current α due to Early voltage effects generated in input transistor Q5 of current mirror circuit 25 is prevented from appearing in output current (current IQ8) of current mirror circuit 25.

16 Claims, 5 Drawing Sheets

DIAGRAM SHOWING EARLY EFFECT CANCELING CIRCUIT 1 ACCORDING TO THE PRINCIPLE DIAGRAM

DIAGRAM SHOWING EARLY EFFECT CANCELING CIRCUIT 1a ACCORDING TO THE PRINCIPLE DIAGRAM

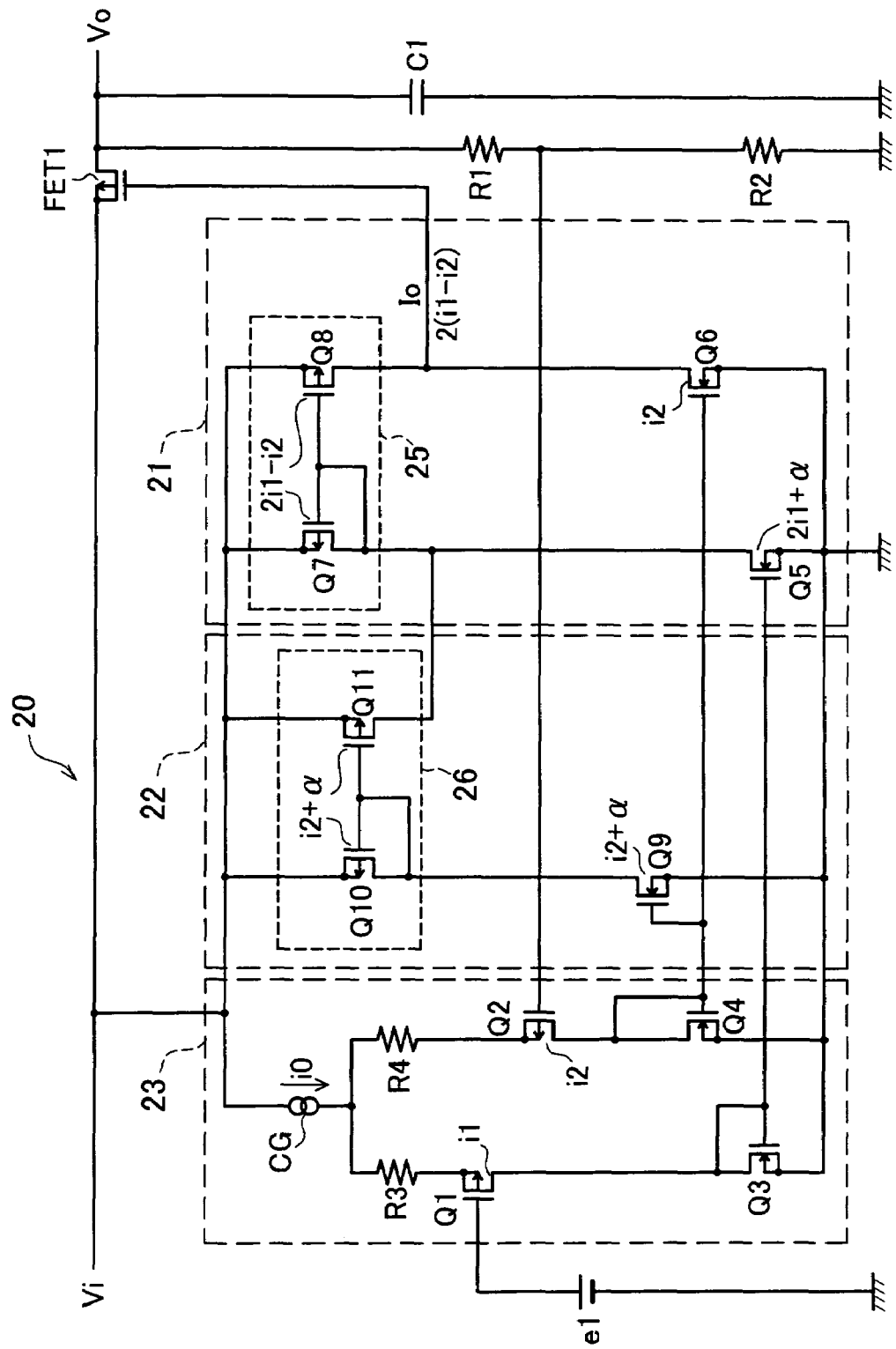
FIG. 3 DIAGRAM SHOWING LINEAR REGULATOR 20 IN FIRST EMBODIMENT

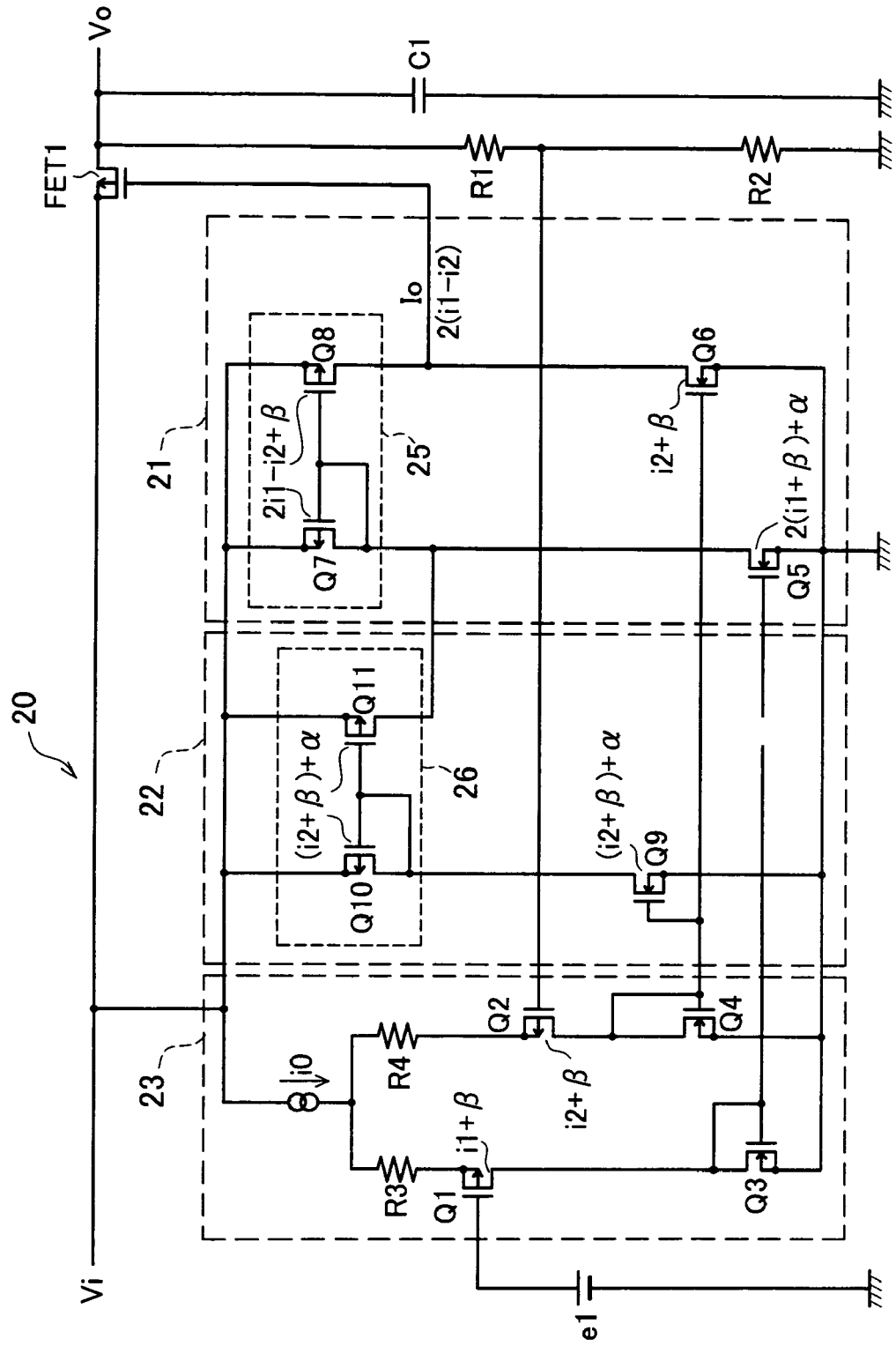
FIG. 4 DIAGRAM SHOWING EFFECTS OF EARLY VOLTAGE CURRENT ON OUTPUT VOLTAGE Vo IN LINEAR REGULATOR 20

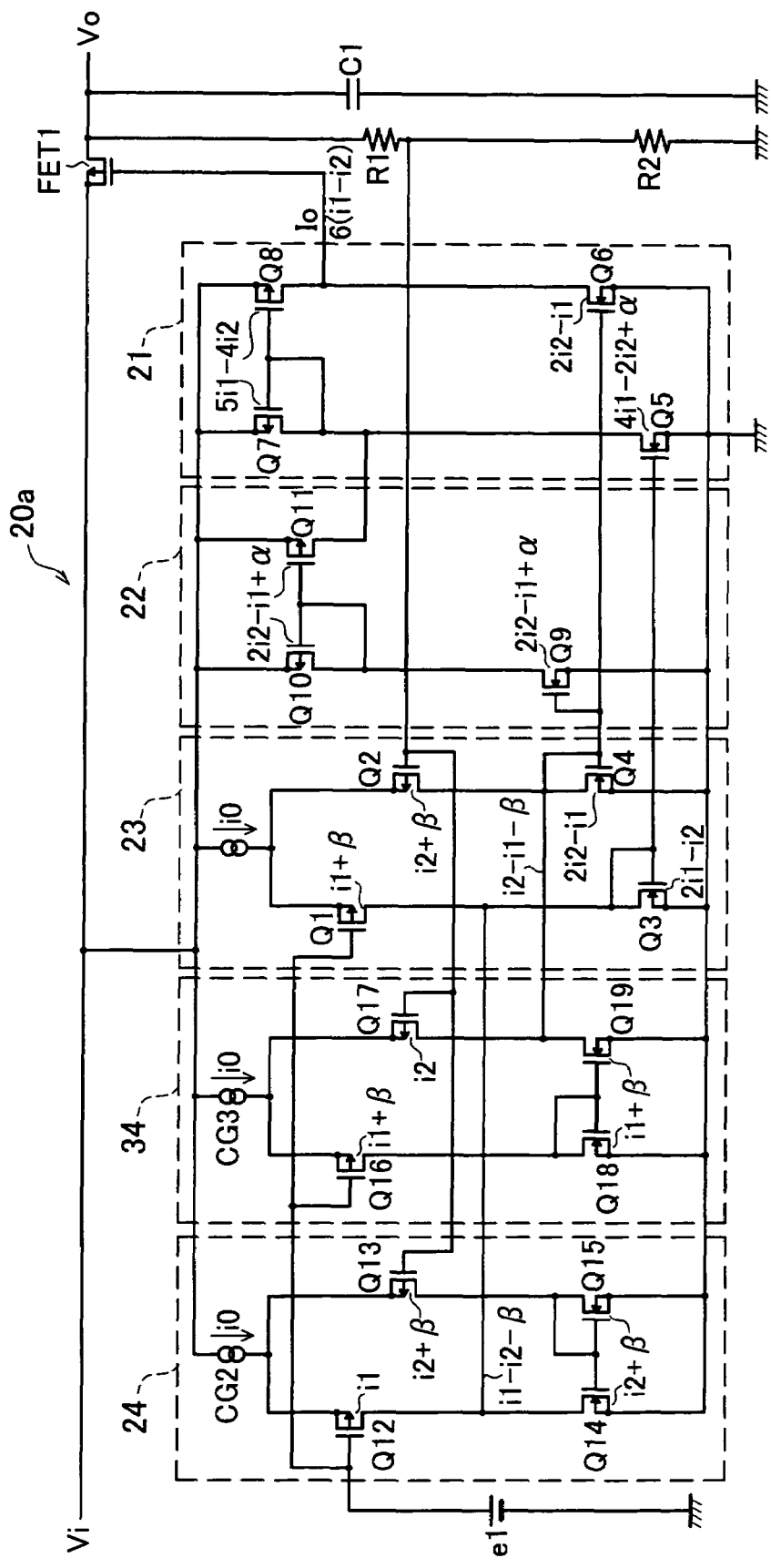
FIG. 5 DIAGRAM SHOWING LINEAR REGULATOR 20a IN SECOND EMBODIMENT

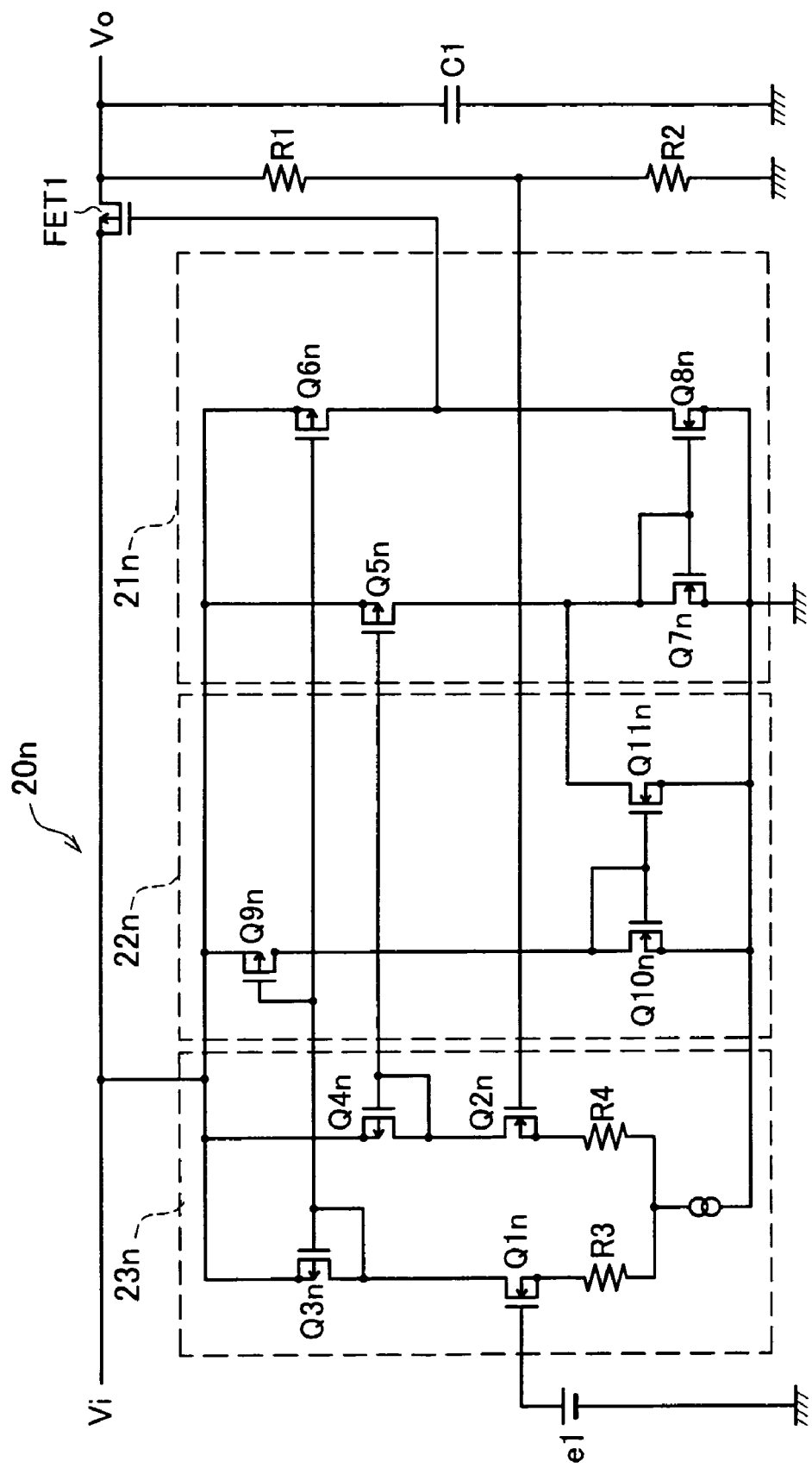
FIG. 6  DIAGRAM SHOWING LINEAR REGULATOR 20n

EARLY EFFECT CANCELLING CIRCUIT, DIFFERENTIAL AMPLIFIER, LINEAR REGULATOR, AND EARLY EFFECT CANCELING METHOD

CROSS-REFERENCE TO RELATED APPLICATIONS

This application is based upon and claims the benefit of priority from the prior Japanese Patent Application No. 2005-051250 filed on Feb. 25, 2005, the entire contents of which are incorporated herein by reference.

BACKGROUND OF THE INVENTION

1. Field of the Invention

The present invention relates to Early effect canceling circuit and Early effect canceling method, and more particularly to circuit and method capable of preventing current generated by Early effect from appearing in output current of current mirror circuit.

2. Description of the Related Art

If current variation components due to Early effects are contained in the input current flowing in the current mirror circuit, its effects directly appear in the output current of the current mirror circuit. Accordingly, this current mirror circuit is explained as an example of using in DC-DC converter of linear regulator system.

In laptop and other portable electronic appliances, batteries are used as power source for appliances, but the battery voltage generally declines as discharge progresses, and it is attempted to stabilize the battery output voltage by using a DC-DC converter in order to keep constant the voltage used in the electronic appliance. In the case of a small output current capacity, a linear regulator is often used in relation to the physical size of DC-DC converter or cost of choke coil. A linear regulator of small capacity is composed of one-chip semiconductor, and the physical size is small and the cost is low. If the input and output voltage ratio is small, the efficiency of linear regulator is a sufficiently practical value. In particular, in sound source circuit or the like where switching noise must be eliminated, the linear regulator is preferably used.

In prior art documents investigated before filing of the present application, no information relating to the invention of the present application has been discovered in publications, papers and other documents printed, filed or disclosed prior to the present application. Hence, the present application cites no prior art and document information.

SUMMARY OF THE INVENTION

If current variation components due to Early effects are contained in the input current flowing in the current mirror circuit, it is a problem because current variation components directly appear in the output current of the current mirror circuit. In particular, when the current mirror circuit is used in linear regulator for sound source circuit, ripple noise may appear in output voltage of linear regulator, and sound quality may deteriorate. To prevent output of ripple noise from linear regulator, ripple noise may be suppressed by force by installing a filter composed of coil (or resistance) and capacitor in the output stage. But such filter uses capacitor, etc. and is wide in mounting area, and causes to increase the chip size.

The invention is devised to solve at least one of the problems of the background art, and it is hence an object thereof to present Early effect canceling circuit and Early effect canceling method capable of preventing current generated by Early effects in an input transistor of current mirror circuit from appearing in the output current of current mirror circuit. It is also an object to present a control circuit of DC-DC converter capable of preventing ripple noise in input voltage from appearing in output voltage.

To achieve the above object, an Early effect canceling circuit in a first idea according to the present invention comprises a current mirror circuit, a first input transistor for supplying input current to the current mirror circuit, an auxiliary current mirror circuit for supplying canceling current to the current mirror circuit, and a second input transistor for supplying the canceling current to the auxiliary current mirror circuit.

The Early effect canceling circuit comprises a current mirror circuit. A first input transistor supplies input current to the current mirror circuit. An auxiliary current mirror circuit supplies canceling current to the current mirror circuit. A second input transistor supplies canceling current to the auxiliary current mirror circuit.

When ripple voltage is generated in supply voltage or the like of the current mirror circuit, a current flowing due to Early voltage effects is generated in the first input transistor. Hence, the input current includes the current generated by Early voltage effects. In the second input transistor, too, a current flowing due to Early voltage effects is generated. The current supplied from the second input transistor is issued from the auxiliary current mirror circuit as canceling current. Hence, the canceling current includes the current generated by Early voltage effects.

The canceling current supplied from the auxiliary current mirror circuit is added to the input current of the current mirror circuit. The current entering the current mirror circuit is the input current minus canceling current. At this time of subtraction, the current caused by Early voltage effects is canceled.

As a result, the current due to Early voltage effects generated in the first input transistor of current mirror circuit is prevented from appearing in the output of the current mirror circuit. Hence, the ripple noise due to Early effects is prevented from leaking to the output current of the current mirror circuit.

Further, an Early effect canceling method in the first idea according to the present invention comprises a step of supplying an input current containing a current generated by Early voltage effects to a current mirror circuit, a step of supplying a canceling current containing a current generated by Early voltage effects to the current mirror circuit, and a step of supplying a current obtained by subtracting the canceling current from the input current to the current mirror circuit.

The input current of the current mirror circuit contains current caused by Early voltage effects. The canceling current also contains current caused by Early voltage effects. The current actually entering the current mirror circuit is obtained by subtracting the canceling current from the input current. At this time of subtraction, the current caused by Early voltage effects is canceled.

As a result, current components caused by Early voltage effects, that is, components contained in the input current are prevented from appearing in the output of the current mirror circuit.

A differential amplifier in a second aspect of the invention is a differential amplifier comprising at least one transistor connected by diode as active load element, and having differential output terminals, and further comprising at least one auxiliary differential amplifier composed by having a current mirror circuit as active load element, in which a pair of input terminals in the auxiliary differential amplifier are connected to the differential input terminals, and the output terminal of the auxiliary differential amplifier is connected to either one of the differential output terminals of the differential amplifier.

The differential amplifier contains the transistor connected by diode and differential output terminals. Then differential amplifier contains at least one auxiliary differential amplifier composed by having the current mirror circuit, in which a pair of input terminals in the auxiliary differential amplifier are connected to the differential input terminals of the differential amplifier respectively, and the output terminals of the auxiliary differential amplifier are connected to at least one of the differential output terminals of the differential amplifier.

Each output current of the differential amplifier contains current components caused by Early voltage effects. Each output current of the auxiliary differential amplifier also contains current components caused by Early voltage effects in a mode corresponding to each output current of the differential amplifier. When the output terminal of the auxiliary differential amplifier is connected to at least one of the differential output terminals, the output current of the auxiliary differential amplifier is merged with the output current of the differential amplifier. At this time of merging, the current caused by Early voltage effects is canceled. As a result, the current components caused by Early voltage effects are prevented from appearing in each output of the differential amplifier.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE SEVERAL VIEWS OF THE DRAWING

FIG. 3 is a diagram showing linear regulator 20 in first embodiment;

FIG. 4 is a diagram showing effects of Early voltage current on output voltage Vo in linear regulator 20;

FIG. 5 is a diagram showing linear regulator 20*a* in second embodiment; and FIG. 6 is a diagram showing linear regulator 20*n*.

DETAILED DESCRIPTION OF THE PREFERRED EMBODIMENTS

Figure 1:
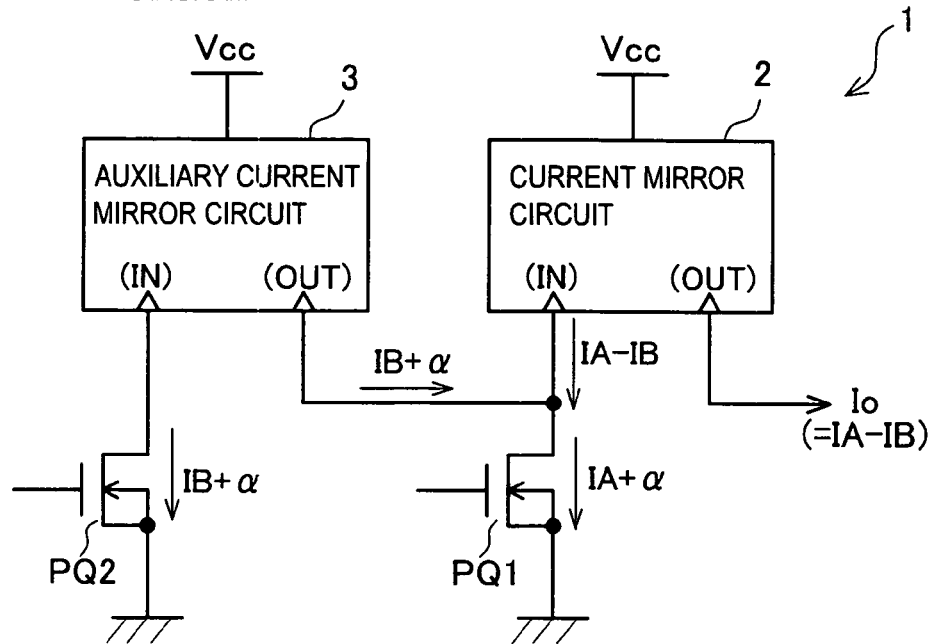
FIG. 1 is a diagram showing Early effect canceling circuit 1 according to the principle diagram.

Specific embodiments of Early effect canceling circuit, differential amplifier, linear regulator, and Early effect canceling method are explained specifically below by referring to the drawings in FIG. 1 to FIG. 6. The principle drawing of the invention is shown in FIG. 1 and FIG. 2.

Figure 2:
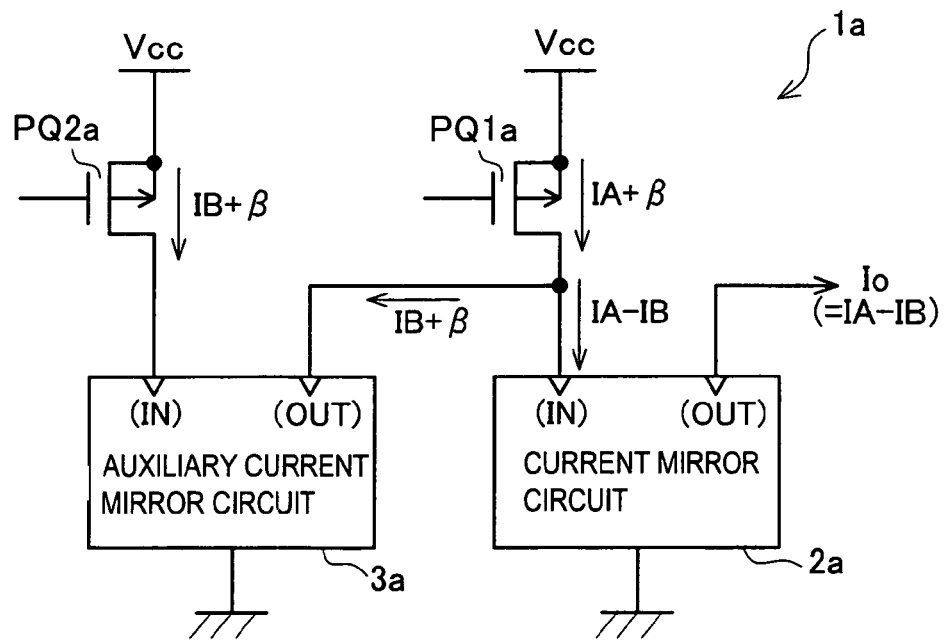
FIG. 2 is a diagram showing Early effect canceling circuit 1*a* according to the principle diagram.

FIG. 1 shows Early effect canceling circuit 1. Early effect canceling circuit 1 comprises a current mirror circuit 2, an auxiliary current mirror circuit 3, and input transistors PQ1 and PQ2. The current mirror circuit 2 and auxiliary current mirror circuit 3 are identical in connection and configuration. The input transistors PQ1 and PQ2 are identical in connection and configuration. The output terminal of auxiliary current mirror circuit 3 is connected to the input terminal of the current mirror circuit 2. Parallel to the current mirror circuit 2, the auxiliary current mirror circuit 3 is connected. The output current of the auxiliary current mirror circuit 3 is added to the input current of the current mirror circuit 2. The current mirror circuit 2 issues an output current Io.

The input transistor PQ1 is connected in series to the diode component section side of the current mirror circuit 2. In this diode component section, a specific amount of voltage drops. When ripple voltage is generated in the supply voltage Vcc which is the power source of the current mirror circuit 2, since the voltage drop amount in the diode component section of the current mirror circuit 2 is fixed, the ripple voltage appears directly on the drain terminal of the input transistor PQ1. As a result, the current IA flowing in the input transistor PQ1 fluctuates due to Early effects. Supposing the current component flowing in the input transistor PQ1 due to Early effects to be current α, the current flowing in the transistor PQ1 is expressed as (IA+α).

Similarly, the current IB flowing in the input transistor PQ2 fluctuates due to Early effects. Herein, the current mirror circuit 2 and auxiliary current mirror circuit 3 are identical in circuit configuration. In both current mirror circuits, same supply voltage Vcc is supplied. Hence, the voltage applied to the current route terminals of the input transistor PQ1 by way of current mirror circuit 2, and the voltage applied to the current route terminals of the input transistor PQ2 by way of auxiliary current mirror circuit 3 are identical. At this time, the ripple voltages of supply voltage Vcc appearing in drain terminals of input transistors PQ1 and PQ2 are also identical. As a result, current fluctuation components appearing in the input transistors PQ1 and PQ2 due to Early effects are supposed to be almost equal to each other. Thus, the current flowing in the input transistor PQ2 due to Early effects can be expressed as α, and the current flowing in the input transistor PQ2 is expressed as (IB+α).

The operation is explained. Parallel to the current mirror circuit 2, the auxiliary current mirror circuit 3 is provided as a circuit for detecting Early voltage. The output current (IB+α) of the auxiliary current mirror circuit 3 is added to the input current of the current mirror circuit 2. The current entering the current mirror circuit 2 is the current flowing in the transistor PQ1 minus the output current of the auxiliary current mirror circuit 3, that is, (IA−IB). It is thus known that the current a occurring due to Early voltage is canceled from the input current to the current mirror circuit 2. The current mirror circuit 2 issues output current Io (=IA−IB).

As a result, current α due to Early voltage effects generated in the input transistor PQ1 in the current mirror circuit 2 is prevented from appearing in the output current Io. At the same time, ripple noise due to Early effect is prevented from leaking to the output current of the current mirror circuit 2.

The current value of output current Io is a differential value of current (current IA) of input transistor PQ1 and current (current IB) of input transistor PQ2. Therefore, to obtain output current Io of specified current value, the values of current IA and current IB should be set properly so that the differential value of current IA and current IB may be the specified current value. Preferably, the values of current IA and current IB should be different from each other.

FIG. 2 shows Early effect canceling circuit 1*a*. Early effect canceling circuit 1*a* is similar to Early effect canceling circuit 1 in FIG. 1, except that the polarity of transistor and connection of supply voltage Vcc-grounding voltage are exchanged. Early effect canceling circuit 1a comprises a current mirror circuit 2a, an auxiliary current mirror circuit 3a, and input transistors PQ1a and PQ2a. The other configuration is same as in Early effect canceling circuit 1 (FIG. 1), and its explanation is omitted.

Due to Early voltage effects, supposing the current flowing in the input transistor PQ1a to be current 1, the current flowing in the transistor PQ1a can be expressed as (IA+β). As mentioned above, due to Early effects, the current flowing in the input transistor PQ2a is also supposed to be current β, the current flowing in the input transistor PQ2 can be expressed as (IB+β). The output current (IB+β) of the auxiliary current mirror circuit 3a is subtracted from the input current of the current mirror circuit 2a. Hence, the current entering the current mirror circuit 2a is the current flowing in the transistor PQ1a minus the output current of the auxiliary current mirror circuit 3a, that is expressed as (IA−IB). It is hence known that the current β generated by Early voltage is canceled from the input current to the current mirror circuit 2a. The current mirror circuit 2a issues output current Io (=IA−IB).

Thus, the current β due to Early voltage effects generated in the input transistor PQ1a of the current mirror circuit 2a is prevented from appearing in the output current Io. That is, ripple noise due to Early effects is prevented from leaking to the output current of the current mirror circuit 2a.

The first and second embodiments of the invention are described below while referring to FIG. 3 to FIG. 5. In the first and second embodiments, the Early effect canceling circuit of the invention is applied in a linear regulator.

In the first embodiment, cancelation of Early voltage effects in driver circuit 21 is explained by referring to FIG. 3. The linear regulator 20 shown in FIG. 3 comprises a driver circuit 21, an Early voltage detector 22, an error amplifier 23, a main transistor FET1, a capacitor C1, and resistance elements R1 and R2. The linear regulator 20 receives an input voltage Vi, and sends out an output voltage Vo. The main transistor FET1 is a transistor for regulating the input voltage Vi, and issuing an output voltage Vo. The input voltage Vi is put in the source electrode of the main transistor FET1, and the output voltage Vo is issued from the drain electrode. An output terminal of the driver circuit 21 is connected to the control electrode (gate) of the main transistor FET1. The capacitor C1 is a capacitor for smoothing the output voltage Vo.

The driver circuit 21 is a circuit for driving the main transistor FET1 by receiving the output of the error amplifier 23. The driver circuit 21 includes transistors Q7, Q8 for composing a current mirror circuit 25 for driving the main transistor FET1. It further includes input transistors Q5, Q6 for receiving differential output signal from the error amplifier 23. The input transistor Q5 of the driver circuit 21 and the output transistor Q3 of the error amplifier 23 are connected by way of the current mirror circuit configuration. The size of the input transistor Q5 is a double size of the output transistor Q3.

The Early voltage detector 22 is a circuit for detecting the current generated by Early voltage effects. The Early voltage detector 22 comprises transistor Q9 for receiving the output from the error amplifier 23, and transistors Q10, Q11 for composing an auxiliary current mirror circuit 26. The driver circuit 21 and Early voltage detector 22 are composed in the same connection relation between terminals.

The error amplifier 23 is a voltage amplifier having an inverting input and a noninverting input. The error amplifier 23 comprises a constant current source CG, resistance elements R3, R4, input transistors Q1, Q2 for differential input, and output transistors Q3, Q4 for output. Reference voltage e1 is entered in the inverting input of the error amplifier 23. The reference voltage e1 is a reference voltage for controlling the output voltage Vo of the linear regulator 20. In the noninverting input of the error amplifier 23, a divided voltage by resistance elements R1, R2 of output voltage Vo of linear regulator is entered. When the resistance values of the resistance elements R1 and R2 are specified voltages with the output voltage Vo being predetermined, the divided voltage is set so as to coincide with the reference voltage e1.

The operation of the linear regulator 20 is explained. Reference voltage e1 is entered in the input transistor Q1 which is inverting input of the error amplifier 23. At this time, the current value of current IQ1 flowing in the transistor Q1 is supposed to be (i1). Since the transistor Q3 connected in series to the input transistor Q1 is composed as diode, the current value of the current IQ3 flowing in the transistor Q3 is also (i1).

In the transistor Q2 which is noninverting input of the error amplifier 23, a voltage of the output voltage Vo divided by resistance elements R1 and R2 is entered. The current value of the current IQ2 flowing in the transistor Q2 at this time is (i2). Since the transistor Q4 is connected in series to the transistor Q2, the current IQ4 flowing in the transistor Q4 is also current (i2). The following formula is established between the current flowing in the input transistors Q1 and Q2, and the current (i0) supplied from the constant current source CG.

$$i0 = i1 + i2 \quad \text{(formula 1)}$$

The output transistor Q3 of the error amplifier 23 and the input transistor Q5 of the driver circuit 21 is connected in current mirror circuit configuration. The size of the input transistor Q5 is a double size of output transistor Q3, and hence the current supply capacity is doubled. Accordingly, the current IQ5 flowing in the input transistor Q5 is 2 times of the current value of the current IQ3 flowing in the transistor Q3, that is, (2(i1)).

Herein, the drain terminal of the input transistor Q5 is connected in series to the transistor Q7. Since the transistor Q7 is composed as diode, the voltage drop amount is constant. In the drain terminal of the input transistor Q5, ripple voltage of input voltage Vi appears directly. By this ripple voltage, the input transistor Q5 receives Early effects. By Early effects, supposing the current flowing in the input transistor Q5 to be current α. Then, the value of the current IQ5 flowing in the input transistor Q5 is expressed by adding this current α, that is, (2(i1)+α).

Similarly, the output transistor Q4 of the error amplifier 23 and the input transistor Q9 of the Early voltage detector 22 are connected in current mirror circuit configuration. The size of input transistor Q9 is same size as output transistor Q4. Hence, the current IQ9 flowing in the input transistor Q9 is current (i2).

The drain terminal of input transistor Q9 is connected in series to transistor Q10. Since transistor Q10 is composed as diode, the voltage drop amount is constant. Therefore, at the drain terminal of the input transistor Q9, ripple voltage of input voltage Vi appears directly, and by this ripple voltage, the input transistor Q9 receives Early effects.

In the input transistor Q9, the current generated by Early effects is explained. Transistor Q7 of current mirror circuit 25 and transistor Q10 of auxiliary current mirror circuit 26 are equivalent in transistor size and identical in diode configuration. In both current mirror circuits, same input voltage Vi is commonly supplied. Accordingly, the voltage applied between current route terminals of input transistor Q5 by way of transistor Q7, and the voltage applied between current route terminals of input transistor Q9 by way of transistor Q10 are equivalent to each other. At this time, ripple voltages of input voltage Vi appearing at drain terminals of input transistors Q9 and Q5 are also equivalent. Hence, the current flowing in the input transistor Q5 by Early effects and the current flowing in the input transistor Q9 by Early effects are generated due to equivalent ripple voltages. The both currents are approximated to be nearly same current values, and the current flowing in the input transistor Q9 by Early effects can be expressed as α. Hence the value of the current IQ9 flowing in the input transistor Q9 is expressed as (i2+α).

The value of the current IQ10 flowing in the transistor Q10 is current value (i2+α) equivalent to current IQ9 because the transistor Q10 is connected in series to the input transistor Q9. The current IQ11 flowing in the output transistor Q11 is current value (i2+α) equivalent to current IQ10 because the transistor Q10 and output transistor Q11 compose a current mirror circuit. Herein, current IQ11 is defined to be canceling current.

The output transistor Q11 is connected parallel to transistor Q7 of driver circuit 21. Current IQ11 which is output current of Early voltage detector 22 flows into the input transistor Q5 of the driver circuit 21. The current IQ7 entering the current mirror circuit 25 is the current flowing in the input transistor Q5 minus the current flowing in the output transistor Q11, which is determined in the following formula.

$$IQ7 = (2(i1) + \alpha) - (i2 + \alpha) \qquad \text{(formula 2)}$$
$$= (2(i1) - i2)$$

As known from formula 2, by adding current IQ11 to current IQ5 of input transistor Q5, current α can be canceled by input current (current IQ7) of current mirror circuit 25. Current IQ8 issued from current mirror circuit 25 is equivalent to current IQ7, that is, (2(i1)–i2), because transistors Q7 and Q8 compose a current mirror circuit.

The output current Io of driver circuit 21 is explained. In the driver circuit 21, the input transistor Q6 and transistor Q8 are connected in series. Hence, the output current Io issued from the junction of the two transistors becomes a difference between current IQ6 flowing in the input transistor Q6 and the current IQ8 issued from the current mirror circuit 25.

Current IQ6 is determined. The input transistor Q6 is connected to the output transistor Q4 and current mirror circuit configuration. The size of both transistors is equivalent. Current IQ6 flowing in transistor Q6 is same as current value (i2) of output transistor Q4. The transistor Q8 connected in series to the input transistor Q6 is a constant current circuit because of current mirror configuration by transistor Q7. Hence the input transistor Q6 is free from Early effects.

The output current Io is determined in the following formula.

$$\text{Output current } Io = IQ8 - IQ6 \qquad \text{(formula 3)}$$
$$= (2(i1) - i2) - (i2)$$
$$= 2(i1 - i2)$$

As known from formula 3, an error current of differential input currents i1, i2 in error amplifier 23 is calculated, and issued as output current Io.

The output current Io is a current for driving the main transistor FET1. That is, when the output voltage Vo drops, the dividing voltage by resistance elements R1 and R2 is lowered, and the input voltage of the noninverting input transistor Q2 of the error amplifier 23 is lowered. As a result, the current i2 flowing in the input transistor Q2 increases, and the current i1 flowing in the input transistor Q1 decreases. At this time, according to formula 3, output current Io decreases, and the gate voltage of main transistor FET1 drops. As the gate voltage drops, the ON resistance of main transistor FET1 decreases, and the output voltage Vo climbs up. Therefore, the output voltage Vo is regulated at specified value.

On the other hand, when the output voltage Vo rises, the dividing voltage by resistance elements R1 and R2 is raised, and the input voltage of the noninverting input transistor Q2 of the error amplifier 23 is raised. As a result, the current i2 flowing in the input transistor Q2 decreases, and the current i1 flowing in the input transistor Q1 increases. At this time, according to formula 3, output current Io increases, and the gate voltage of main transistor FET1 rises, and the ON resistance of main transistor FET1 increases, and the output voltage Vo drops. Therefore, the output voltage Vo is regulated at specified value.

As specifically described herein, the Early effect canceling circuit in the linear regulator 20 in the first embodiment comprises an Early voltage detector 22 which has same connection and configuration as the driver circuit 21, and is connected parallel to the driver circuit 21, and detects the current flowing in the input transistor Q9 of the Early voltage detector 22. By Early voltage effects, current α generated in the input transistor Q5 of the driver circuit 21 can be detected.

Canceling current (current IQ11) issued from Early voltage detector 22 is added to input current (current IQ5) of driver circuit 21. As a result, in the input current (current IQ7) of current mirror circuit 25, current α due to Early voltage effects can be canceled. Hence, the input and output currents of the current mirror circuit 25 are prevented from varying due to Early voltage effects. Thus, current α due to Early voltage effects generated in the input transistor Q5 of the current mirror circuit 25 is prevented from appearing in the output current (current IQ8) of the current mirror circuit 25. Therefore, ripple noise in input voltage Vi is prevented from appearing in the output voltage of the linear regulator 20.

In other words, having the Early voltage detector 22 in the same configuration as the driver circuit 21, same ripple current as the ripple current generated in the driver circuit 21 is generated in Early voltage detector 22. By adding the output current of Early voltage detector 22 containing the ripple current to the input current of the driver circuit 21, the ripple current in the input current is canceled.

According to the linear regulator 20 using the driver circuit 21 and Early voltage detector 22, current α generated in the input transistor Q5 of the current mirror circuit 25 is prevented from appearing in the output current Io for controlling the main transistor FET1. Hence, the linear regulator 20 withstanding more firmly the ripple noise of input voltage Vi can be composed. Thus, the output voltage Vo can be controlled at high precision.

According to the embodiment, the canceling current (current IQ11) including the current a due to Early voltage effects is decreased from the input current (current IQ5) of the current mirror circuit 25. Herein, as the canceling current, it is preferred to use the differential input current (i2) in the error amplifier 23. The ratio of the input current (current IQ5), canceling current (current IQ9), and differential input current (current IQ6) is preferred to be set at 2:1:1. In input current (current IQ7) of current mirror circuit 25, first differential input current (current IQ11=i2) is subtracted. In output current Io, second differential input current (current IQ6=i2) is subtracted. As a result, the differential input current (i2) is subtracted twice from other differential input current (i1). Hence, in order that the value of current IQ5 may be a double current value of input current (i1), the size of transistor Q5 is set at 2 times of the value of transistor Q3. Therefore, the operation result of error current (2(i1−i2)) can be issued to output current Io.

The second embodiment of the invention is described by referring to FIG. 4 and FIG. 5. In the second embodiment, it is intended to cancel Early voltage effects in the error amplifier 23. First, using the linear regulator 20 of the same configuration as in the first embodiment, effects of current due to Early voltage generated in the error amplifier 23 on output voltage Vo are explained by referring to FIG. 4.

Reference voltage e1 is put in input transistor Q1 of inverting input of error amplifier 23. The drain terminal of input transistor Q1 is connected in series to transistor Q3 in diode configuration. Hence, the input transistor Q1 receives Early effects. Suppose the current flowing in the input transistor Q5 due to Early effect to be current β. The current flowing due to reference voltage e1 is supposed to be i1. Hence, the value of current IQ1 flowing in the input transistor Q1 can be expressed as (i1+β).

The current flowing in the input transistor Q2 is explained. Transistor Q3 and transistor Q4 are in same transistor size, and composed in identical diode configuration. Accordingly, the voltage applied to current route terminals of input transistor Q1 by way of transistor Q3, and the voltage applied to current route terminals of input transistor Q2 by way of transistor Q4 are equal to each other. Ripple voltages of input voltage Vi appearing at drain terminals of input transistors Q1 and Q2 are also equivalent. Hence, the current flowing in the input transistor Q1 by Early effects and the current flowing in the input transistor Q2 by Early effects flow due to equivalent ripple voltages. The both currents are approximated to be nearly same current values, and the current flowing in the input transistor Q2 by Early effects can be expressed as current β. Hence the value of the current IQ2 flowing in the input transistor Q2 is expressed as (i2+β).

Since the transistor Q3 connected in series to the transistor Q1 is composed as diode, the current flowing in the transistor Q3 is also i1+β. Output transistor Q3 of error amplifier 23 and input transistor Q5 of driver circuit 21 are connected in current mirror configuration. Since the size of the input transistor Q5 is a double size of the output transistor Q3, a double current 2(i1+β) of transistor Q3 appears in transistor Q5. Since the transistor Q7 connected in series to the input transistor Q5 is composed as diode, current a due to Early voltage effects flows in the input transistor Q5. Hence, the current IQ5 flowing in the input transistor Q5 can be expressed as (2 (i1+β)+α). That is, it is known that the current β generated in the error amplifier 23 is amplified, and directly appears in current IQ5 as input current of current mirror circuit 25.

Output transistor Q4 of error amplifier 23 and input transistor Q6 of driver circuit 21 are connected in current mirror circuit configuration. The transistor Q8 connected in series to the transistor Q6 is a constant current circuit for current mirror configuration by transistor Q7. Hence, the transistor Q6 is free from Early voltage effects. Therefore, the current IQ6 of the input transistor Q6 is (i2+β), same as the current value flowing in the transistors Q2, Q4.

Similarly, output transistor Q4 of error amplifier 23 and input transistor Q9 of Early voltage detector circuit are connected in current mirror circuit configuration, and transistor Q10 connected in series to transistor Q9 is composed as diode. Hence, current IQ9 flowing in transistor Q9 is a total current of current value i2+β same as in transistor Q4 and current a due to Early voltage effects, and expressed as ((i2+β)+α). Since transistor Q10 is connected in series to input transistor Q9, current IQ10 flowing in transistor Q10 is same as current IQ9. Since output transistors Q11 and Q10 compose a current mirror circuit, current IQ11 flowing in transistor Q11 is equivalent to current IQ9. Hence, current IQ11 is expressed as ((i2+β)+α).

Output transistor Q11 of Early voltage detector 22 is connected in parallel to the transistor Q7 of driver circuit 21. Current IQ11, that is, output current of Early voltage detector 22 is added to the input current of driver circuit 21. Hence, the value of current IQ7 entering the current mirror circuit 25 is the current IQ5 (2(i1+β)+α) minus current IQ11 (current value (i2+β)+α), that is, (2i1−i2+β).

Since transistor Q7 and transistor Q8 compose a current mirror circuit, current IQ8 flowing in transistor Q8 is (2i1−i2+β). Since transistor Q6 and transistor Q8 are connected in series, the current value of output current Io is a difference of current IQ8 and current IQ6, and is expressed in the following formula.

$$\text{Output current } Io = (2i1 - i2 + \beta) - (i2 + \beta) \quad \text{(formula 4)}$$
$$= 2(i1 - i2)$$

As known from formula 4, current β generated due to Early voltage effects of error amplifier 23 is canceled by output current Io. This is because current β generated in error amplifier 23 due to Early voltage effects flows in all transistors from transistor Q1 to Q11, and is hence canceled each other at the time of calculating the difference in the driver circuit 21. In an actual circuit, however, current β receives effects of fluctuations among transistors and others. It is hence preferred for calculating an accurate differential current in the driver circuit 21 that effects of current β are canceled in the output stage of current from the error amplifier 23. By providing a circuit for detecting Early voltage in parallel in each input of error amplifier 23, canceling method of current β in output current of error amplifier 23 is effective.

A linear regulator 20a in the second embodiment is explained by referring to FIG. 5. Early voltage effects appear in inverting input side transistor Q1 to which reference voltage e1 of error amplifier 23 is connected, and noninverting input side transistor Q2 receiving divided voltage of output voltage Vo. Hence, the linear regulator 20a has first auxiliary error amplifier 24 and second auxiliary error amplifier 34 in parallel to each input. Hence, this is a method of preventing Early voltage effects from appearing in output current of error amplifier 23.

The first auxiliary error amplifier 24 and second auxiliary error amplifier 34 are a differential input current mirror circuit composition having a same element configuration as the error amplifier 23. The first auxiliary error amplifier 24 is connected in parallel to the inverting input side transistor Q1 of the error amplifier 23, and second auxiliary error amplifier 34 is connected in parallel to the noninverting input side transistor Q2 of the error amplifier 23.

The first auxiliary error amplifier 24 includes inverting input side transistor Q12 to which reference voltage e1 is connected, and noninverting input side transistor Q13 receiving divided voltage of output voltage Vo. It also has transistors Q14, Q15 for auxiliary current mirror circuit as output unit. It further has constant current source CG2 for issuing same current as constant current source CG of error amplifier 23.

The second auxiliary error amplifier 34 includes inverting input side transistor Q16 to which reference voltage e1 is connected, and noninverting input side transistor Q17 receiving divided voltage of output voltage Vo. It also has transistors Q18, Q19 for auxiliary current mirror circuit as output unit. It further has constant current source CG3 for issuing same current as constant current source CG of error amplifier 23.

The operation of the first auxiliary error amplifier 24 is explained. The first auxiliary error amplifier 24 is a circuit for canceling current $\beta$ generated in transistor Q1 due to Early voltage effects. Transistor Q13 receives a divided voltage, that is, output voltage Vo being divided by resistance elements R1 and R2. Since transistor Q13 is connected in series to transistor Q15 of diode configuration, a current is generated in transistor Q13 due to Early voltage effects. Since the first auxiliary error amplifier 24 and error amplifier 23 are identical in element configuration, currents generated in transistor Q13 and transistor Q2 due to Early effects may be approximated to be nearly same current values. Hence, the current flowing in transistor Q13 due to Early effects is expressed as current $\beta$. The value of current IQ13 flowing in transistor Q13 is therefore (i2+$\beta$). Since the transistor Q15 connected in series to transistor Q13 is also composed as diode, the current flowing in transistor Q15 is also (i2+$\beta$).

Reference voltage e1 is put in transistor Q12 of inverting input of first auxiliary error amplifier 24. Transistor Q14 connected in series to transistor Q12 composes a current mirror circuit together with transistor Q15, and is hence a constant current circuit. Therefore, transistor Q12 is free from Early voltage effects. At this time, the current value of current IQ12 flowing in transistor Q12 is same as in transistor Q1, that is, (i1).

Transistor Q12 and transistor Q14 are connected in series. Hence, the output current of first auxiliary error amplifier 24 is the difference of current i1 flowing in transistor Q12 and current i2+$\beta$ flowing in transistor Q14, and is determined in the following formula.

$$i1-(i2+\beta)=i1-i2-\beta \qquad \text{(formula 5)}$$

The value of current IQ1 of input transistor Q1 of error amplifier 23 is expressed as (i1+$\beta$) as mentioned above. Output transistor Q3 is connected in series to transistor Q1, and is also connected in parallel to output transistor Q14 of first auxiliary error amplifier 24. Hence, current IQ3 flowing in output transistor Q3 is expressed in the following formula.

$$IQ3=(i1+\beta)+(i1-i2-\beta)=2i1-i2 \qquad \text{(formula 6)}$$

According to formula 6, it is known that current $\beta$ due to Early voltage effects is canceled at current IQ3.

The operation of the second auxiliary error amplifier 34 is explained. The second auxiliary error amplifier 34 is a circuit for canceling current $\beta$ generated in transistor Q2 due to Early voltage effects. Reference voltage e1 is put in transistor Q16. Since transistor Q16 is connected in series to transistor Q18 of diode configuration, a current is generated in transistor Q16 due to Early voltage effects. Since the second auxiliary error amplifier 34 and error amplifier 23 are identical in element configuration, currents generated in transistor Q16 and transistor Q1 due to Early effects may be approximated to be nearly same current values. Hence, the current flowing in transistor Q16 due to Early effects is expressed as current $\beta$. The value of current IQ16 is therefore expressed as (i1+$\beta$). Since the transistor Q18 connected in series to transistor Q16 is also composed as diode, the current flowing in transistor Q18 is also (i1+$\beta$).

Transistor Q17 receives a divided voltage, that is, output voltage Vo being divided by resistance elements R1 and R2. Transistor Q19 connected in series to transistor Q17 composes a current mirror circuit together with transistor Q18, and is hence a constant current circuit. Therefore, transistor Q17 is free from Early voltage effects. At this time, the current value of current IQ17 flowing in transistor Q17 is same as in transistor Q2, that is, (i2).

Transistor Q19 and transistor Q17 are connected in series. Hence, the output current of second auxiliary error amplifier 34 is the current difference of transistor Q17 and transistor Q19, and is determined in the following formula.

$$i2-(i1+\beta)=i2-i1-\beta \qquad \text{(formula 7)}$$

The value of current IQ2 of input transistor Q2 of error amplifier 23 is expressed as (i2+$\beta$) as mentioned above. Hence, current IQ4 flowing in output transistor Q4 is expressed in the following formula.

$$IQ4=(i2+\beta)+(i2-i1-\beta)=2i2-i1 \qquad \text{(formula 8)}$$

According to formula 6 and formula 8, current $\beta$ is canceled at currents IQ3, IQ4 as output currents of error amplifier 23.

Output current Io of driver circuit 21 is explained. Detail of operation is same as in linear regulator 20 in the first embodiment, and specific description is omitted. The value of current IQ5 flowing in the input transistor Q5 of the driver circuit 21 is expressed as (4(i1)−2(i2)+$\alpha$) by adding current a due to Early effects. The value of current IQ9 flowing in the input transistor Q9 of Early voltage detector 22 is expressed as (2(i2)−i1+$\alpha$). The value of current IQ11 flowing in the output transistor Q11 is expressed as (2(i2)−i1+$\alpha$). Current IQ7 entering the current mirror circuit 25 is current IQ5 minus current IQ11. That is, current IQ7=(5(i1)−4(i2)). Hence, it is known that current a is canceled at current IQ7.

Current IQ8 is an equal value to current IQ7. Current IQ6 is expressed as (2(i2)−i1). Output current Io is a difference of current IQ6 flowing in input transistor Q6 and current IQ8 issued from current mirror circuit 25, and is expressed in the following formula.

$$\text{Output current } Io = IQ8 - IQ6 \quad \text{(formula 9)}$$
$$= (5(i1) - 4(i2)) - (2(i2) - i1)$$
$$= 6(i1 - i2)$$

As known from formula 9, differential current of differential input currents i1, i2 in the error amplifier 23 is calculated, and issued as output current Io.

As described herein, the error amplifier 23 in the linear regulator 20a in the second embodiment comprises Early voltage detector circuit (first auxiliary error amplifier 24, second auxiliary error amplifier 34) in parallel to each input of the error amplifier 23. Output current of first auxiliary error amplifier 24 is added to input current (current IQ1) of error amplifier 23. Output current of second auxiliary error amplifier 34 is added to input current (current IQ2) of error amplifier 23. Thus, current β generated in error amplifier 23 due to Early voltage effects can be canceled from output current of error amplifier 23. Accordingly, the input and output currents of driver circuit 21 are prevented from varying due to effects of current β, so that the linear regulator 20a may be operated more accurately.

In other words, ripple currents equivalent to ripple currents generated in inputs of error amplifier 23 are generated in first auxiliary error amplifier 24, second auxiliary error amplifier 34 having same element structure as the error amplifier 23. By the output currents of first auxiliary error amplifier 24, second auxiliary error amplifier 34 including ripple currents, the ripple currents in the error amplifier 23 are canceled with each other.

The invention is not limited to these embodiments alone, but it may be changed and modified variously without departing from the scope of the invention. In the embodiment, in FIG. 3 to FIG. 5, PMOS transistors are used in the current mirror circuit and error amplifier, but not limited to this type, for example, NMOS transistors may be used, and same effects are obtained. For example, instead of the linear regulator 20 (FIG. 3), it may be composed as linear regulator 20n as shown in FIG. 6. A driver circuit 21n (FIG. 6) comprises transistors Q5n to Q8n. The driver circuit 21n is similar to the driver circuit 21 (FIG. 3), except that NMOS transistors and PMOS transistors are exchanged, and that the connection relation of input voltage Vi and grounding voltage is inverted. Early voltage detector 22n and error amplifier 23n are also similarly composed.

In the embodiment, the input transistor Q5 has a double transistor size of the output transistor Q3, but the size is not specified. It is enough when the current supply capacity of transistors Q5, Q9, Q6 is set so that the ratio of input current (current IQ5), canceling current (current IQ9), and differential input current (current IQ6) may be a ratio of 2:1:1.

In the second embodiment (FIG. 5), method of preventing Early voltage effects of error amplifier 23 is explained. The error amplifier of the invention is not limited to use in DC-DC converter alone, but may be applied in general differential amplifier.

In the second embodiment, the error amplifier 23 is explained as an error amplifier having one inverting input and one noninverting input, but the invention is not limited to this mode. If a plurality of inverting inputs or noninverting inputs are present, a circuit for detecting Early voltage (auxiliary error amplifier) may be provided parallel in each input. As a result, in the output of the error amplifier, appearance of Early voltage effects can be prevented.

In the embodiment, as an example of use of error amplifier of the invention, DC-DC converter of linear regulator system is explained, but this is not limited. Also in the DC-DC converter of switching regulator system, an error amplifier is used for amplifying the difference of reference voltage and output voltage. Hence the invention can be applied also in the DC-DC converter of switching regulator system.

In the embodiment, MOS transistors are used, but bipolar transistors may be also used, and same effects are obtained.

In the embodiment, the current mirror circuit is composed of two transistors, but not limited to this configuration, various compensation circuits may be provided.

The input transistor Q5 is an example of first input transistor, the input transistor Q9 is an example of second input transistor, the input transistor Q6 is an example of third input transistor, the current IQ11 is an example of canceling current, the error amplifier 23 is an example of differential amplifier, and the first auxiliary error amplifier 24 and second auxiliary error amplifier 34 are examples of auxiliary differential amplifiers, respectively.

According to the Early effect canceling circuit and Early effect canceling method of the invention, in the input transistor of current mirror circuit, the current generated by Early effect is prevented from appearing in the output current of the current mirror circuit. According to the control circuit of DC-DC converter of the invention, ripple noise in input voltage is prevented from appearing in the output voltage of the DC-DC converter.

What is claimed is:

1. An Early effect canceling circuit comprising:
a current mirror circuit;
a first input transistor for supplying input current to the current mirror circuit;
an auxiliary current mirror circuit for supplying a canceling current to the current mirror circuit, the auxiliary current mirror circuit having an output terminal that is connected to an input terminal of the current mirror circuit; and
a second input transistor for supplying the canceling current to the auxiliary current mirror circuit.

2. The Early effect canceling circuit of claim 1, wherein the voltage applied to current route terminals of the first input transistor by way of the current mirror circuit is equivalent to the voltage applied to current route terminals of the second input transistor by way of the auxiliary current mirror circuit.

3. The Early effect canceling circuit of claim 1, wherein the input current supplied from the first input transistor and the canceling current supplied from the second input transistor are different current values.

4. The Early effect canceling circuit of claim 1, wherein the canceling current is supplied so as to decrease the input current supplied to the current mirror circuit.

5. The Early effect canceling circuit of claim 1, wherein one current route terminal of the first input transistor is connected to a input terminal in the current mirror circuit to which a transistor connected as diode is connected, and one current route terminal of the second input transistor is connected to a control terminal of a transistor connected as diode in the auxiliary current mirror circuit.

6. The Early effect canceling circuit of claim 1, wherein the current mirror circuit and first input transistor, and the auxiliary current mirror circuit and second input transistor are composed in same connection relation between terminals, respectively.

7. The Early effect canceling circuit of claim 1, wherein the input current is a differential input current, and the differential current in the differential input current is calculated and issued.

8. The Early effect canceling circuit of claim 7, wherein the canceling current is a current generated on the basis of either one of differential input currents.

9. The Early effect canceling circuit of claim 7, further comprising:
a third input transistor connected to a output terminal in the current mirror circuit to which a transistor is not connected as diode,
wherein one of the differential input currents is fed into the first input transistor, and other differential input current is fed into the second input transistor and third input transistor.

10. The Early effect canceling circuit of claim 9, wherein the canceling current supplied from the second input transistor, and the differential input current fed from the third input transistor are equal to each other, and the current supply capacity of the first input transistor is 2 times of the current supply capacity of the second input transistor and third input transistor.

11. The Early effect canceling circuit of claim 7, further comprising a differential amplifier, wherein the differential input current is issued from the differential amplifier.

12. A differential amplifier having at least one transistor connected as diode as an active load element, and differential output terminals, comprising:
at least one auxiliary differential amplifier including a current mirror circuit as an active load element,
wherein a pair of input terminals in the auxiliary differential amplifier are connected to the differential input terminals, and the output terminal of the auxiliary differential amplifier is connected at least to either one of the differential output terminals.

13. The differential amplifier of claim 12, further comprising:
two sets of the auxiliary differential amplifier, wherein the output terminal of each auxiliary differential amplifier is connected to each differential output terminal.

14. A control circuit of a DC-DC converter comprising:
an Early effect canceling circuit of claim 1, wherein a main transistor is controlled depending on the output current of the Early effect canceling circuit.

15. A control circuit of a DC-DC converter comprising:
a differential amplifier of claim 12, wherein a main transistor is controlled depending on an output current of the differential amplifier.

16. An Early effect canceling method comprising:
a step of supplying an input current containing a current generated by Early voltage effects to a current mirror circuit;
a step of supplying a canceling current containing a current generated by Early voltage effects to the current mirror circuit; and
a step of supplying a current obtained by subtracting the canceling current from the input current to the current mirror circuit.

* * * * *